US007595658B2

(12) United States Patent
Yeh et al.

(10) Patent No.: US 7,595,658 B2
(45) **Date of Patent: *Sep. 29, 2009**

(54) VOLTAGE DIVIDER CIRCUIT

(75) Inventors: Liang-Hua Yeh, Taipei County (TW); Ho-Ming Su, Taoyuan County (TW)

(73) Assignee: Chunghwa Picture Tubes, Ltd., Taoyuan (TW)

( * ) Notice: Subject to any disclaimer, the term of this patent is extended or adjusted under 35 U.S.C. 154(b) by 166 days.

This patent is subject to a terminal disclaimer.

(21) Appl. No.: 11/769,721

(22) Filed: Jun. 28, 2007

(65) Prior Publication Data

US 2007/0273405 A1 Nov. 29, 2007

Related U.S. Application Data

(63) Continuation of application No. 11/163,854, filed on Nov. 1, 2005, now Pat. No. 7,265,584.

(51) Int. Cl.
*H03K 17/16* (2006.01)
*H03K 19/003* (2006.01)

(52) U.S. Cl. ............................ 326/33; 326/82; 326/83

(58) Field of Classification Search ....................... None
See application file for complete search history.

(56) References Cited

U.S. PATENT DOCUMENTS 7,265,584 B2 * 9/2007 Yeh et al. ...................... 326/82
2003/0201959 A1 * 10/2003 Sakaguchi .................. 345/87

FOREIGN PATENT DOCUMENTS

CN 1361910 7/2002
CN 1421757 6/2003

* cited by examiner

*Primary Examiner*—Anh Q Tran
(74) *Attorney, Agent, or Firm*—Jianq Chyun IP Office

(57) ABSTRACT

The present invention provides a voltage divider circuit capable of reducing a number of external devices and lowering the cost and power consumption. The present invention includes a plurality of resistors connected in series, a plurality of buffers and at least one source driver IC. In addition, a first terminal of the first resistor is electrically connected to a DC voltage and the first terminal of each of the remaining resistors is electrically connected to the second terminal of the previous resistor. The second terminal of the last resistor is grounded. The buffers and the resistors are correspondingly electrically connected, wherein the first terminals of the resistors are electrically connected to their corresponding input terminals of buffers. Moreover, the output terminals of the buffers are electrically connected to source driver ICs, wherein the buffers are one of the built-in buffers in each source driver IC.

8 Claims, 4 Drawing Sheets

VOLTAGE DIVIDER CIRCUIT

CROSS-REFERENCE TO RELATED APPLICATION

This application is a continuation application of a prior application Ser. No. 11/163,854, filed Nov. 1, 2005. All disclosure of the US application is incorporated herein by reference.

BACKGROUND OF THE INVENTION

1. Field of the Invention

The present invention generally relates to a voltage divider circuit, and more particularly, to a voltage divider circuit adapted for a thin film transistor display (TFT LCD).

2. Description of Related Art

In the driving circuit for TFT LCDs, each source driver IC (integrated circuit) needs a set of DC voltages ranging from a low level to a high level, called a divided voltage. FIG. 1 depicts a voltage divider circuit 100 implemented in a current notebook computer, wherein a voltage is first divided by a plurality of first resistors R1 connected in series, and after the divided voltage passes through a buffer B consisting of operational amplifiers, the divided voltage is further divided into 10 voltage levels that range from V1 (low voltage) to V10 (high voltage) by a plurality of resistors R2. Next, these 10 voltage levels are input to the source driver ICs S1-S8. As the number of buffers B implemented in the circuit is small, manufacturing cost is accordingly lowered; however, the divided voltages are not easily adjusted because they are easily affected by the internal resistances in the source driver ICs S1-S8.

On the other hand, FIG. 2 depicts a conventional voltage divider circuit 200 implemented in the current TFT LCD panel, wherein a voltage is divided by a plurality of first resistors R connected in series, and after the divided voltage passes through a buffer B, 18 divided voltages with voltage level ranging from V1 TO V18 are obtained and then input to the source driver ICs S1-S10. In addition, the voltage divider circuit 200 employs more buffers to overcome the drawbacks of the voltage divider circuit 100, but the manufacturing cost is accordingly increased.

The objective of the present invention is directed to a voltage divider circuit that have the advantageous of the preceding two voltage divider circuits 100 and 200.

SUMMARY OF THE INVENTION

Accordingly, the present invention is directed to a voltage divider circuit capable of reducing a number of external components in the voltage divider circuit to lower the cost and power consumption. The voltage divider circuit is characterized in that the divided voltages can be easily adjusted without being affected by the internal resistance in the source driver ICs.

The present invention is further directed to provide a TFT LCD for decreasing the number of buffers implemented in a voltage divider circuit, thereby reducing cost and current consumption.

Based on the above objective and other objectives, the present invention provides a voltage divider circuit characterized in that the conventional external buffers connected between the DC voltage and the driver ICs are replaced by the built-in buffers in the source driver ICs.

In one embodiment, the voltage divider circuit comprises a plurality of resistors connected in series, a plurality of buffers and at least one source driver IC. In addition, a first terminal of the first resistor is electrically connected to a DC voltage and a first terminal of each of the remaining resistors is electrically connected to the second terminal of the previous resistor. The second terminal of the last resistor is grounded. The buffers and the resistors correspond with each other, wherein the first terminals of the resistors are electrically connected to their corresponding input terminals of the buffers and among these buffers, at least the first and the last buffers are rail-to-rail buffers. Moreover, the output terminals of buffers are electrically connected to the source driver ICs, wherein the each source driver IC contains one of the built-in buffers.

To achieve the above objective and other objectives, the present invention provides another TFT LCD that comprises a TFT LCD panel, a voltage divider circuit, a gate driver IC and a timing controller. Wherein the TFT LCD panel comprises a plurality of pixels, the voltage divider circuit comprises at least one source driver IC so as to provide divided voltages thereto, and replaces buffers originally required by the voltage divider circuit with the buffers comprised in the source driver IC. Moreover, the source driver IC outputs a voltage signal required for displaying pictures to the pixels.

On the other hand, a gate driver IC supplies pulse signals to the pixels so as to allow the pixels to receive the voltage signal output from the source driver IC. The timing controller provides signals required by the voltage divider circuit and the gate driver IC, and coordinates their operating timings.

The present invention employs the built-in buffers in each source driver IC to replace the buffers used in the conventional voltage divider circuit. Therefore, the number of external components in the conventional voltage divider circuit is reduced so as to lower cost. On the other hand, the built-in buffers in the source driver IC inherently consume power. The present invention does not increase power consumption, and further avoids power consumption in the external buffers in the conventional voltage divider circuit. Furthermore, the source driver ICs already have enough built-in buffers that receive one of the divided voltages in the present invention, such that the present invention is characterized in that divided voltages are easily adjusted without being affected by the internal resistance in the source driver ICs.

The objectives, other features and advantages of the invention will become more apparent and easily understood from the following detailed description of the invention when taken in conjunction with the accompanying drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
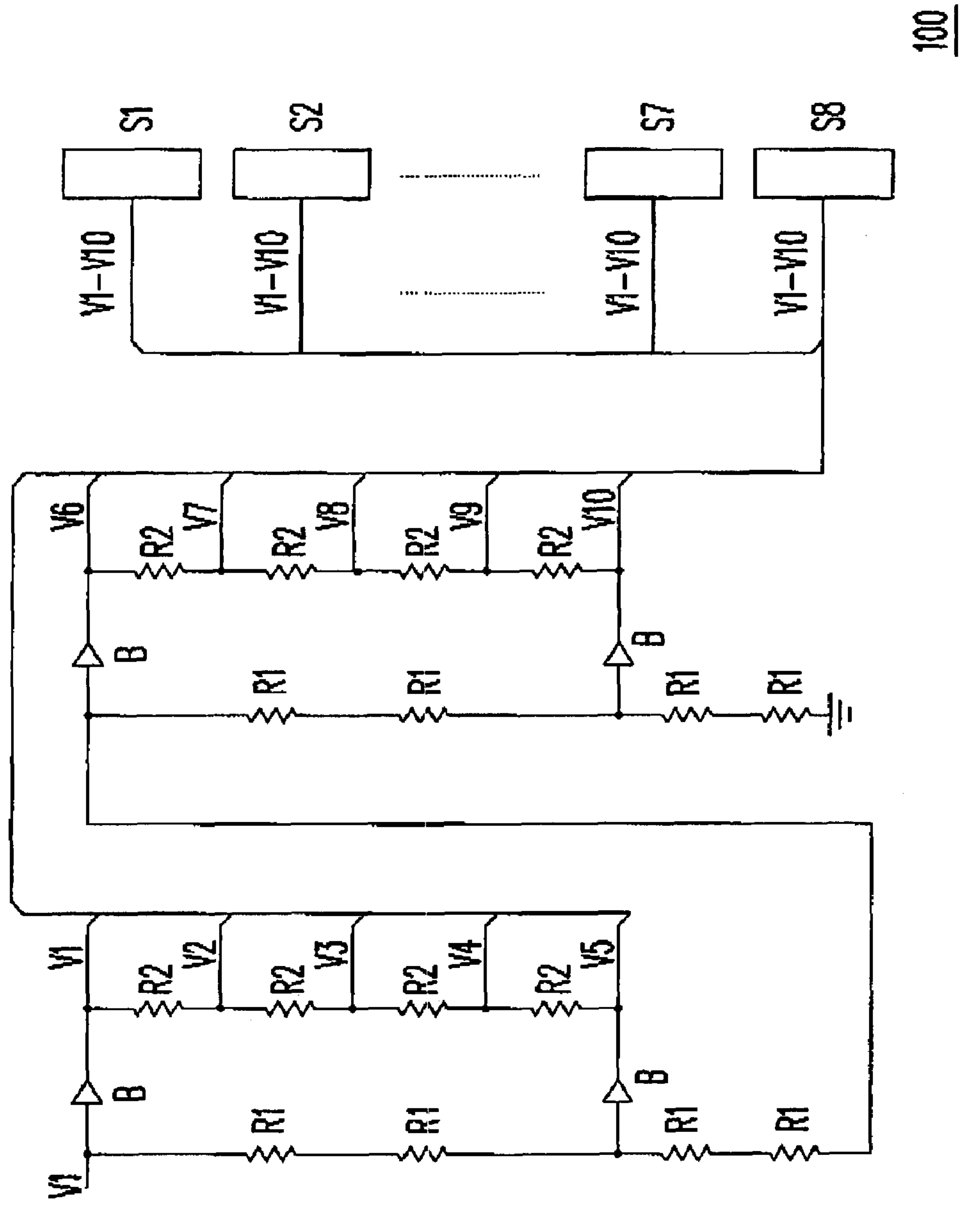
FIG. 1 (PRIOR ART)
FIG. 1 is a conventional voltage divider circuit.
Figure 2:
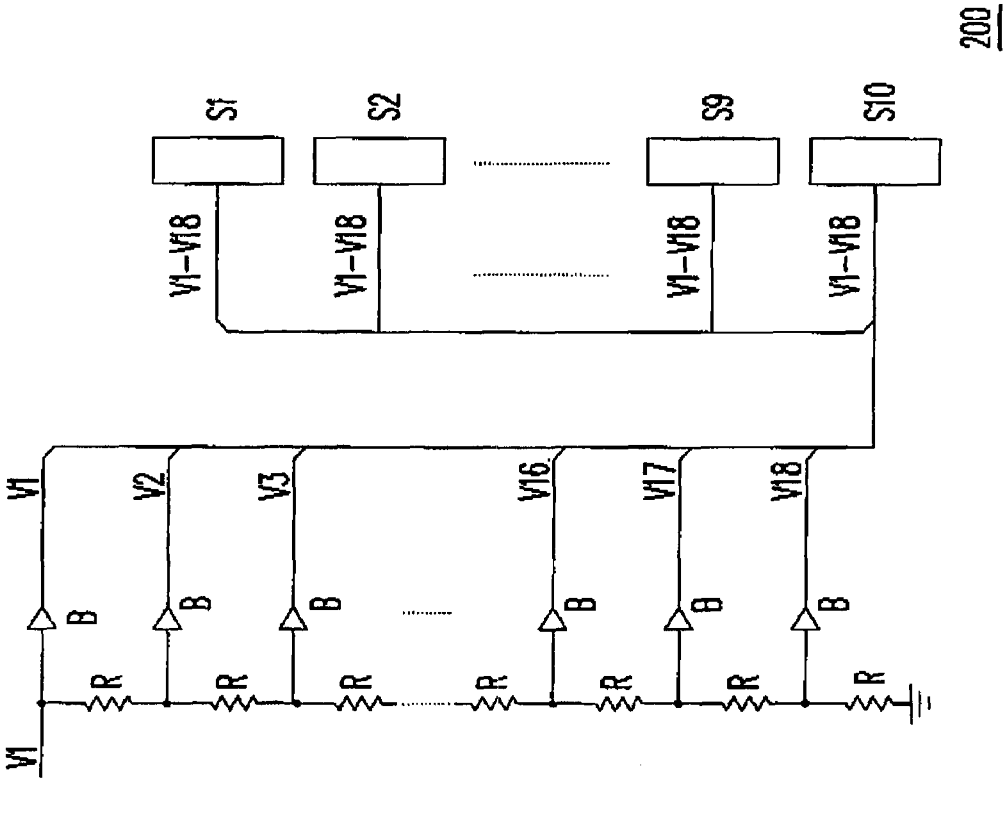
FIG. 2 (PRIOR ART)
FIG. 2 is another conventional voltage divider circuit.

Reference will now be made in detail to the present preferred embodiments of the invention, examples of which are illustrated in the accompanying drawings. Wherever possible, the same reference numbers are used in the drawings and the description to refer to the same parts.

The voltage divider circuit of the present invention is characterized in that the conventional buffers connected between the DC voltage and the driver ICs are replaced by the built-in buffers in the source driver ICs. The current source driver ICs have at least two built-in buffers serving as spare circuit during a repairing period. However, the small-size TFT LCD panel used in the notebooks has a high yield so that these built-in buffers are rarely used and can be used to replace the conventional external buffers in the conventional voltage divider circuit. In regard to a large-size TFT LCD panel used in a liquid crystal television, although it has a low yield, sufficient built-in buffers can be implemented in the voltage divider circuit as long as the source driver ICs with more built-in buffers are used. Hence, the present invention is suitable for a TFT LCD panel of any size.

In addition, to provide a precise divided voltage, the first one or two buffers (closest to the first divided voltage V1) and the last one or two buffers (farthest away from the first divided voltage V1), are rail-to-rail buffers. Since the built-in buffers in source driver ICs of the present invention are rail-to-rail buffers, they meet the preceding requirement.

Figure 3:
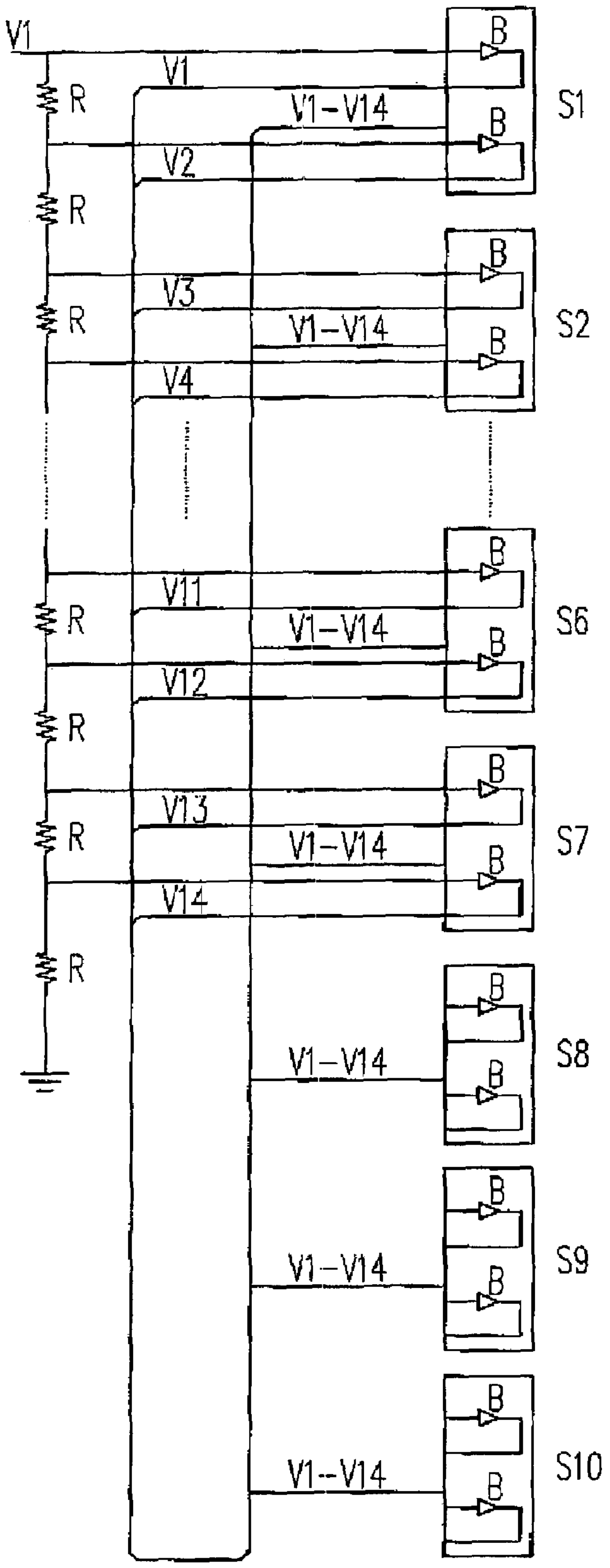
FIG. 3 is a voltage divider circuit of one embodiment of the present invention.

FIG. 3 is a voltage divider circuit of one embodiment of the present invention. The voltage divider circuit 300 comprises 14 resistors connected in series, which are referred to as a first resistor (i.e. a resistor directly connected to the DC V1), a second resistor, and so on; 10 source driver ICs S1-S10, and 20 built-in buffers B contained in 10 source driver ICs S1-S10. In this embodiment, each of the 10 source driver ICs S1-S10 has two built-in buffers B. In addition, the first terminal of the first resistor R is electrically connected to a DC voltage V1 and the first terminal of each of the remaining resistors is electrically connected to the second terminal of the previous resistor. The second terminal of the last resistor is grounded. The first 14 of all 20 built-in buffers B and the resistors correspond with each other, wherein the first terminals of the resistors are electrically connected to their corresponding input terminals of buffers. Moreover, the first 14 built-in buffers B are used while the rest are idle.

In this embodiment, the built-in buffers B serve to remove a parallel connection effect between the resistors R and the internal resistances in source driver ICs S1-S10 so as to maintain the divided voltages V1-V14 and promote their driving capability. All built-in buffers B are comprised of operational amplifiers; however, the operational amplifiers can be substituted by other devices with the same function.

In addition to providing the built-in buffers B, the source driver ICs S1-S10 receive the divided voltages V1-V14 from each built-in buffer B. The source driver ICs S1-S10 serve to provide the voltage signals for pixel electrodes to display images in TFT LCD panels.

Note that the present invention is not limited to the number of resistors, source driver ICs, built-in buffers, rail-to-rail buffers or built-in buffers contained in each source driver IC. In addition, the numbers of the preceding described elements depend on a requirement of an application. For example, as shown in FIG. 3, the number of built-in buffers B is larger or equal to the number of the resistors.

Figure 4:
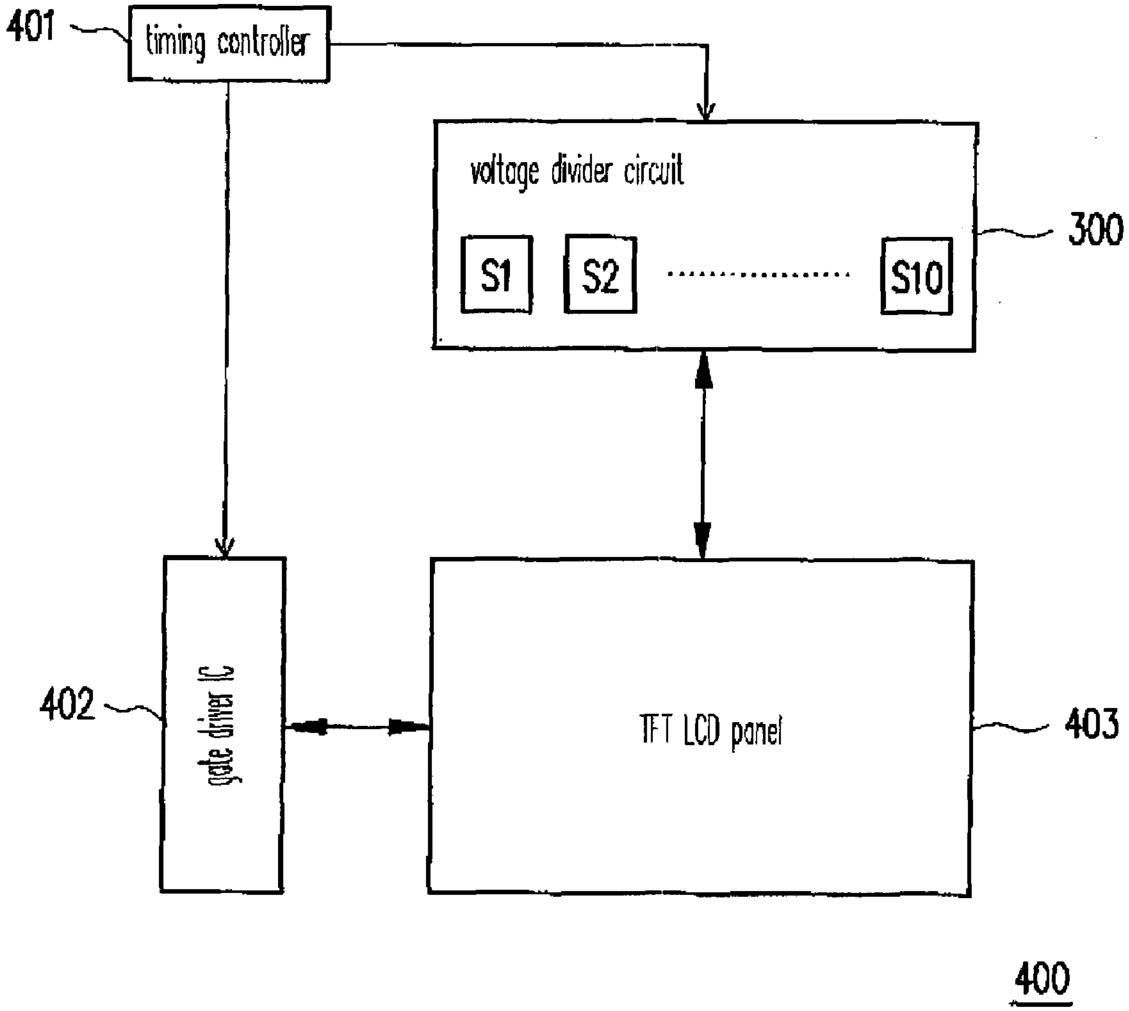
FIG. 4 schematically shows a TFT LCD of another embodiment of the present invention.

FIG. 4 schematically shows a TFT LCD 400 of another embodiment of the present invention. The TFT LCD 400 comprises a TFT LCD panel 403, the voltage divider circuit 300, a gate driver IC 402 and a timing controller 401. Wherein the TFT LCD panel 403 comprises a plurality of pixels, the voltage divider circuit 300 comprises ten source driver ICs S1-S10 so as to provide divided voltages thereto, and replaces buffers originally required by the voltage divider circuit 300 with the buffers comprised in the source driver ICs S1-S10. Moreover, the source driver ICs S1-S10 outputs a voltage signal required for displaying pictures to the pixels of the TFT LCD panel 403.

On the other hand, a gate driver IC 402 supplies pulse signals to the pixels so as to allow the pixels to receive the voltage signal output from the source driver ICs S1-S10. The timing controller 401 provides signals required by the voltage divider circuit 300 and the gate driver IC 402, and coordinates their operating timings.

In summary, the present invention employs the built-in buffers in each source driver IC to replace the buffers used in the conventional voltage divider circuit. Therefore, the number of external components in the conventional voltage divider circuit is reduced so as to lower cost. On the other hand, the built-in buffers inherently consume power. The present invention does not increase power consumption, but further avoids power consumed by the external buffers in the conventional voltage divider circuit. Furthermore, the source driver ICs already have enough built-in buffers that receive one of the divided voltages in the present invention, such that the present invention is characterized in that the divided voltages can be easily adjusted without being affected by the internal resistance in the source driver ICs.

In regard to saving the cost and power consumption, for example, in one embodiment of the present invention, originally four external operational amplifiers are used to provide 10 divided voltages. The absence of four operational amplifiers can save 0.16 watts. For a TFT LCD panel of 14.1 inches, the power-saving efficiency is 0.16 W/1.1 W=14%. Further, the present invention can lower the cost over the conventional voltage divider circuit.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A thin film transistor liquid crystal display, comprising a thin film transistor liquid crystal display panel, comprising a plurality of pixels;

a voltage divider circuit, comprising a plurality of source driver ICs, n resistors connected to a voltage in series so as to provide divided voltages to the source driver ICs, m buffers built in the source driver ICs, wherein the source driver ICs output voltage signals required for displaying pictures to the pixels of the thin film transistor liquid crystal display panel, n is an integer greater than zero, m is an integer greater than n, the n resistors are respectively electrically connected to the input terminals of n of the m buffers;

a gate driver IC configured for providing pulse signals to the pixels so as to allow the pixels to receive voltage signals output from the source driver ICs; and a timing controller configured for providing signals required by the voltage divider circuit and the gate driver IC, and coordinating their operating timings.

2. The thin film transistor liquid crystal display of claim 1, wherein the output terminal of each of said n of the m buffers is electrically connected to each of the source driver ICs for outputting the divided voltage thereto.

3. An improved voltage divider circuit, characterized in that a external buffer connected between a DC voltage and a driver IC (integrated circuit) is replaced by a built-in buffer contained in the source driver IC;

Wherein further comprising a plurality of resistors connected in series, wherein a first terminal of the first resistor is electrically connected to a DC voltage and the first terminal of each of the remaining resistors is electrically connected to a second terminal of the previous resistor, while the second terminal of the last resistor is grounded;

a plurality of buffers, connected to the resistors correspondingly, wherein the first terminals of the resistors are electrically connected to their corresponding input terminals of buffers, and at least the buffer electrically connected to the first terminal of the first resistor as well as the buffer electrically connected to the first terminal of the last resistor are rail-to-rail buffers;

at least one source driver IC, wherein the output terminals of the buffers are electrically connected to the source driver ICs and the buffers are one of the built-in buffers in each source driver IC;

wherein a number of the resistors is 14 and a number of the source driver ICs is 10;

wherein the source driver ICs comprise 20 built-in buffers, of which 14 buffers are used to be electrically connected to their corresponding resistors.

4. The voltage divider circuit according to claim 3, wherein each source driver IC comprises two of the 20 built-in buffers.

5. A thin film transistor liquid crystal display, comprising a TFT LCD panel, comprising a plurality of pixels;

a voltage divider circuit, comprising at least one source driver ICs so as to provide divided voltages thereto, and replacing buffers originally required by the voltage divider circuit with the buffers comprised in the source driver ICs, wherein the source driver ICs output a voltage signal required for displaying pictures to the pixels of the TFT LCD panel;

a gate driver IC, providing pulse signals to the pixels so as to allow the pixels to receive voltage signals output from the source driver ICs; and a timing controller, providing signals required by the voltage divider circuit and the gate driver IC, and coordinating their operating timings;

wherein the voltage divider circuit further comprises:

a plurality of resistors connected in series, wherein a first terminal of the first resistor is electrically connected to a DC voltage and the first terminal of each of the remaining resistors is electrically connected to a second terminal of the previous resistor, while the second terminal of the last resistor is grounded;

a plurality of buffers, connected to the resistors correspondingly, wherein the first terminals of the resistors are electrically connected to their corresponding input terminals of buffers, and at least the buffer electrically connected to the first terminal of the first resistor as well as the buffer electrically connected to the first terminal of the last resistor are rail-to-rail buffers;

at least one source driver IC, wherein the output terminals of the buffers are electrically connected to the source driver ICs and the buffers are one of the built-in buffers in each source driver IC;

wherein a number of the source driver ICs is 10;

wherein the source driver ICs comprise 20 built-in buffers, of which 14 buffers are used to be electrically connected to their corresponding resistors.

6. A thin film transistor liquid crystal display, comprising a TFT LCD panel, comprising a plurality of pixels;

a voltage divider circuit, comprising at least one source driver ICs so as to provide divided voltages thereto, and replacing buffers originally required by the voltage divider circuit with the buffers comprised in the source driver ICs, wherein the source driver ICs output a voltage signal required for displaying pictures to the pixels of the TFT LCD panel;

a gate driver IC, providing pulse signals to the pixels so as to allow the pixels to receive voltage signals output from the source driver ICs; and a timing controller, providing signals required by the voltage divider circuit and the gate driver IC, and coordinating their operating timings;

wherein the voltage divider circuit further comprises:

a plurality of resistors connected in series, wherein a first terminal of the first resistor is electrically connected to a DC voltage and the first terminal of each of the remaining resistors is electrically connected to a second terminal of the previous resistor, while the second terminal of the last resistor is grounded;

a plurality of buffers, connected to the resistors correspondingly, wherein the first terminals of the resistors are electrically connected to their corresponding input terminals of buffers, and at least the buffer electrically connected to the first terminal of the first resistor as well as the buffer electrically connected to the first terminal of the last resistor are rail-to-rail buffers;

at least one source driver IC, wherein the output terminals of the buffers are electrically connected to the source driver ICs and the buffers are one of the built-in buffers in each source driver IC;

wherein a number of the source driver ICs is 10;

wherein each source driver IC comprises two of the 20 built-in buffers.

7. A thin film transistor liquid crystal display, comprising a thin film transistor liquid crystal display panel, comprising a plurality of pixels;

a voltage divider circuit, comprising a plurality of source driver ICs, a plurality of resistors connected to a voltage in series so as to provide divided voltages to the source driver ICs, a plurality of buffers built in the source driver ICs, wherein the source driver ICs output voltage signals required for displaying pictures to the pixels of the thin film transistor liquid crystal display panel, the number of the plurality of buffers is more than the number of the plurality of resistors, the plurality of resistors are respectively electrically connected to the input terminals of a part of the plurality of buffers;

a gate driver IC configured for providing pulse signals to the pixels so as to allow the pixels to receive voltage signals output from the source driver ICs; and a timing controller configured for providing signals required by the voltage divider circuit and the gate driver IC, and coordinating their operating timings.

8. The thin film transistor liquid crystal display of claim 7, wherein the output terminal of each of said the part of the plurality of buffers is electrically connected to each of the source driver ICs for outputting the divided voltage thereto.

* * * * *